United States Patent [19]

Inoue

[11] Patent Number: 5,432,110
[45] Date of Patent: Jul. 11, 1995

[54] METHOD FOR FABRICATING NON-VOLATILE SEMICONDUCTOR MEMORY DEVICE HAVING TWO-LAYERED GATE STRUCTURE TRANSISTOR

[75] Inventor: Tatsuro Inoue, Tokyo, Japan

[73] Assignee: NEC Corporation, Tokyo, Japan

[21] Appl. No.: 5,567

[22] Filed: Jan. 19, 1993

[30] Foreign Application Priority Data

Jan. 16, 1992 [JP] Japan .................. 4-025679

[51] Int. Cl.6 ........................ H01L 21/8247
[52] U.S. Cl. ........................ 437/43; 437/48; 437/52; 437/984; 257/316
[58] Field of Search ............. 437/43, 48, 228, 984, 437/52; 257/315, 316

[56] References Cited

U.S. PATENT DOCUMENTS

| | | | |
|---|---|---|---|
| 5,032,881 | 7/1991 | Sardo et al. | 357/23.5 |
| 5,110,753 | 5/1992 | Gill et al. | 437/52 |
| 5,210,047 | 5/1993 | Woo et al. | 437/43 |
| 5,306,935 | 4/1994 | Esquivel et al. | 257/315 |

FOREIGN PATENT DOCUMENTS 2-65275  3/1990  Japan .

Primary Examiner—Olik Chaudhuri
Assistant Examiner—Richard A. Booth
Attorney, Agent, or Firm—Burns, Doane, Swecker & Mathis

[57] ABSTRACT

A method is for fabricating a non-volatile semiconductor memory device with a two-layered gate electrode structure having a control gate electrode and a floating gate electrode. A first insulating film, a first amorphous silicon film, a first gate insulating film, a first polycrystalline silicon film, a second gate insulating film, and a second polycrystalline film are sequentially formed on a semiconductor substrate. Then, using a patterning mask, predetermined regions of the second polycrystalline silicon film, the second gate insulating film, the first polycrystalline silicon film, the first gate insulating film, and the first amorphous silicon film are sequentially and selectively removed, so that only element isolation regions are exposed. Thereafter, after the formation of a control gate electrode, etc., a drain region and a source region are formed on the first amorphous silicon film. In this way, the floating gate electrode and the element isolation region are self-aligned and it is possible to achieve a high density integration of memory cells. Also, there is no leakage current since no diffusion layers are formed on the semiconductor substrate.

4 Claims, 10 Drawing Sheets

METHOD FOR FABRICATING NON-VOLATILE SEMICONDUCTOR MEMORY DEVICE HAVING TWO-LAYERED GATE STRUCTURE TRANSISTOR

BACKGROUND OF THE INVENTION

1. Field of the Invention

The present invention relates to a method for fabricating a non-volatile semiconductor memory device, and more particularly to a method for fabricating a non-volatile semiconductor memory device having a two-layered gate electrode transistor.

2. Description of the Related Art

A typical example of a conventional non-volatile semiconductor memory device is shown in FIG. 1 and its fabrication steps are illustrated in FIGS. 2A through 7A and 2B through 7B. First, a conventional method for fabricating the semiconductor memory device is explained with reference to the drawings. FIGS. 2A through 7A are sectional views of the device taken along the line A—A' in FIG. 1 and FIGS. 2B through 7B are sectional views of the same device taken along the line B—B' in FIG. 1 for explaining each of the sequential fabrication steps.

The arrangement shown in FIG. 1 includes a drain region 200, a source region 201, a channel region 202, a control gate electrode 203, a floating gate electrode 204, a drain contact hole 205, a metal wiring 206 and an element isolation region 207.

First, on a predetermined region of a semiconductor substrate 1 made of a material such as silicon (Si) are formed a first insulating film 2 and a first gate insulating film 4 made of such as silicon dioxide ($SiO_2$) by a conventional method. Next, after a first polycrystalline silicon film 5 is patterned at predetermined regions, a second gate insulating film 6 made of such as silicon dioxide is formed (FIGS. 2A and 2B).

Next, a second polycrystalline silicon film 7 is formed (FIGS. 3A and 3B). Then, a patterning mask 15 of such as a resist is formed so as to cover only the portion which becomes a control gate electrode. With this mask being used, the second polycrystalline silicon film 7, the second gate insulating film 6, and the first polycrystalline silicon film 5 are sequentially and selectively etched. For conducting these etchings, the most common technique used is, for purposes of reducing size deviations, anisotropic etching such as reactive ion etching (RIE) (FIGS. 4A and 4B).

Thereafter, the first gate insulating film 4 that is exposed is etched-back and, after the patterning mask 15 is removed, a second insulating film 34 of such as silicon dioxide is formed. Then, implantation of N-type impurities of such as arsenic (As) is performed, thereby forming a drain region 22 and a source region 23. For example, a first interlayer insulating film 25 of TEOS (Tetraethylortho-silicate $Si(OC_2H_5)_4$) or BPSG (Boro-phospho-silicate glass) is formed using a low pressure Chemical Vapor Deposition (CVD) method (FIGS. 5A and 5B).

Furthermore, a drain contact hole 27 and a source contact hole (not shown) are formed using, for example, a patterning mask 26 (FIGS. 6A and 6B).

After the patterning mask 26 is removed, a metal wiring 28 of, for example, aluminum (Al) is patterned, whereby a non-volatile semiconductor memory device shown in FIGS. 7A and 7B is obtained.

In the conventional method for fabricating a nonvolatile semiconductor memory device described above, the occurrence of bird's beaks cannot be avoided since element isolation regions are formed by oxidizing an upper part of the semiconductor substrate.

The bird's beaks not only cause the channel current to be reduced due to the reduction in the channel width but also make it difficult to scale down the element isolation regions. This is a great barrier for the enhancement of higher integration of the memory cells.

Also, in the conventional device, since the drain/source regions are provided on a semiconductor substrate, it is not possible to avoid a Junction leakage current to be generated when the voltage is applied. This presents a problem in that the current consumption is wasted where the device is highly integrated.

SUMMARY OF THE INVENTION

It is, therefore, an object of the invention to overcome the problems existing in the conventional device and to provide an improved non-volatile semiconductor memory device.

It is also an object of the present invention to provide a method for fabricating a non-volatile semiconductor device which permits the EPROM to be highly integrated and in which an increase in a Junction leakage current to a semiconductor substrate is prevented where the device is highly integrated.

According to one aspect of the present invention, there is provided a method for fabricating a non-volatile semiconductor memory device with a two-layered gate electrode structure having a control gate electrode and a floating gate electrode, the method comprising the steps of:

depositing and forming sequentially on a surface of a semiconductor substrate a first insulating film, a first semiconductor film, a first gate insulating film, a second semiconductor film, a second gate insulating film, and a third semiconductor film;

removing sequentially and selectively predetermined regions of the third semiconductor film, the second gate insulating film, the second semiconductor film, the first gate insulating film, and the first semiconductor film;

forming and etching-back a second insulating film; and depositing and forming a fourth semiconductor film.

According to the fabricating steps of the present invention, on the semiconductor substrate are sequentially deposited a first insulating film, a first amorphous silicon film, a first gate insulating film, a first polycrystalline silicon film, a second gate insulating film, and a second polycrystalline silicon film. Then, the second polycrystalline silicon film to the first amorphous silicon film are sequentially and selectively etched using a patterning mask so as to have only an element isolation region exposed. Thereafter, after the formation of a control gate electrode, etc., a drain region and a source region are formed on the first amorphous silicon film.

When the above procedure is used, the floating gate electrode and the element isolation region are self-aligned.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the present invention will be explained with reference to the accompanying drawings. It is to be noted that, throughout the following explanation, similar reference symbols or numerals refer to the same or similar elements in all the figures of the drawings.

Figure 1:
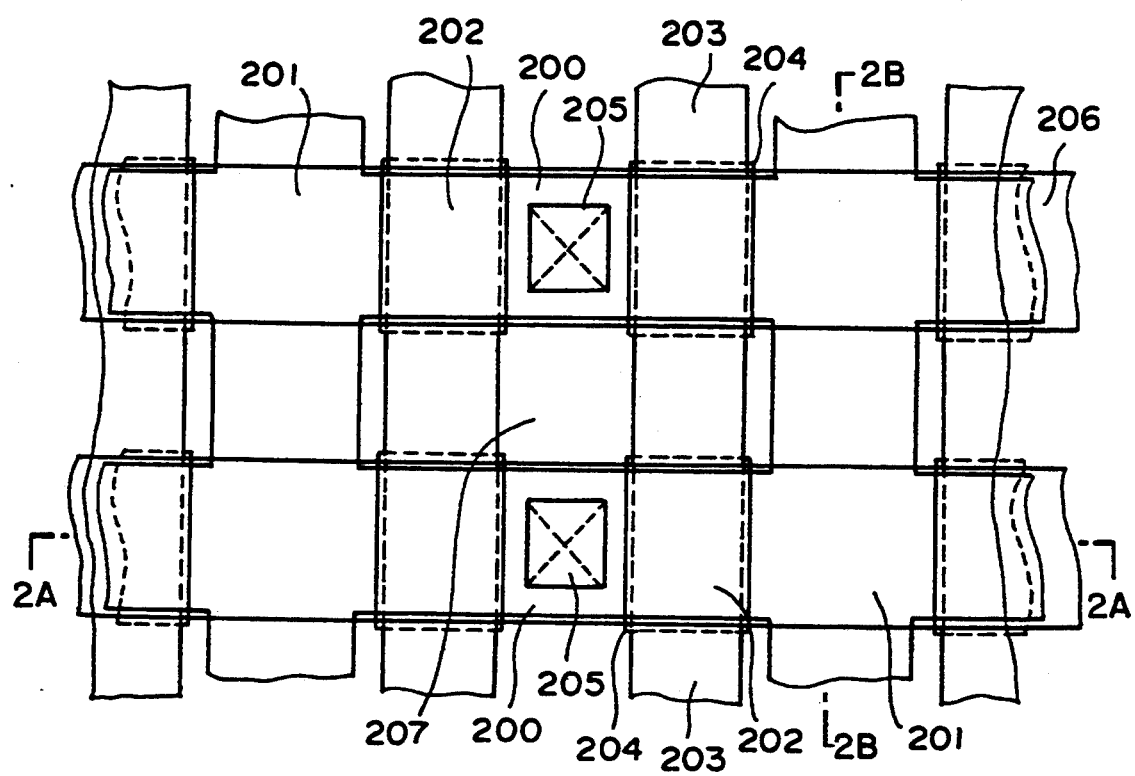
FIG. 1 is a plan view showing a structure of a conventional non-volatile semiconductor memory device.
Figure 2A:
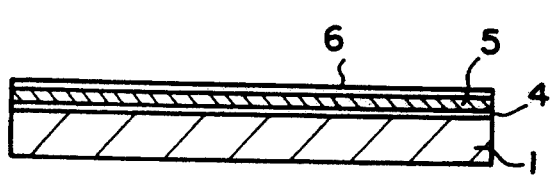
FIGS. 2A, 3A, 4A, 5A, 6A and 7A are sectional views of the structure shown in FIG. 1, taken along the line A—A' in FIG. 1, for explaining sequential fabrication steps thereof.
Figure 2B:
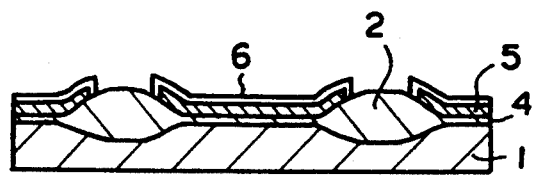
FIGS. 2B, 3B, 4B, 5B, 6B and 7B are sectional views of the structure shown in FIG. 1, taken along the line B—B' in FIG. 1, for explaining the sequential fabrication steps thereof.
Figure 3A:
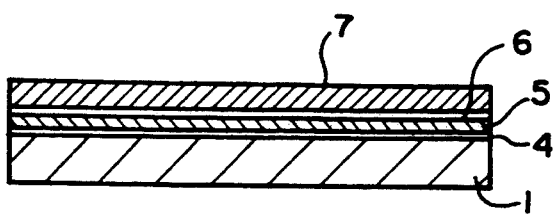
Figure 3B:
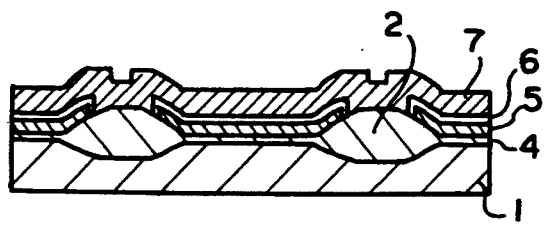
Figure 4A:
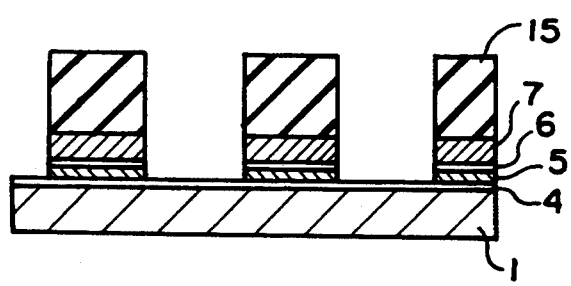
Figure 4B:
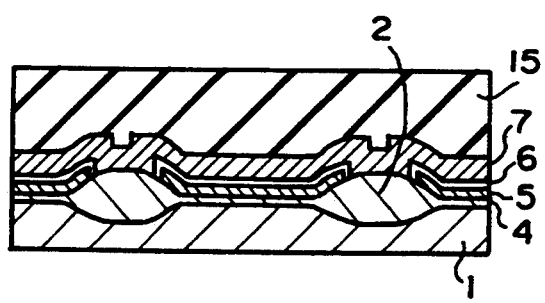
Figure 5A:
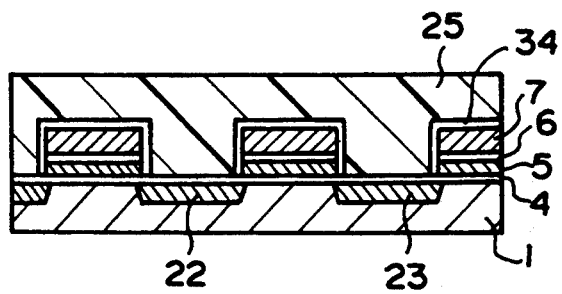
Figure 5B:
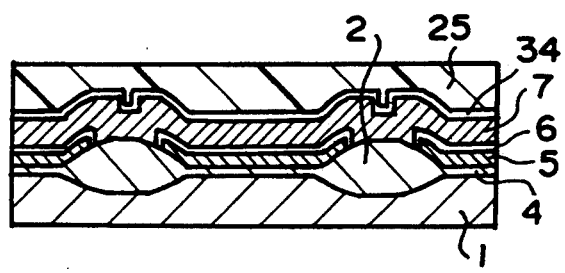
Figure 6A:
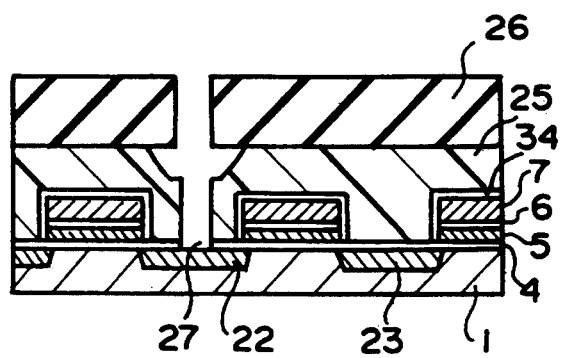
Figure 6B:
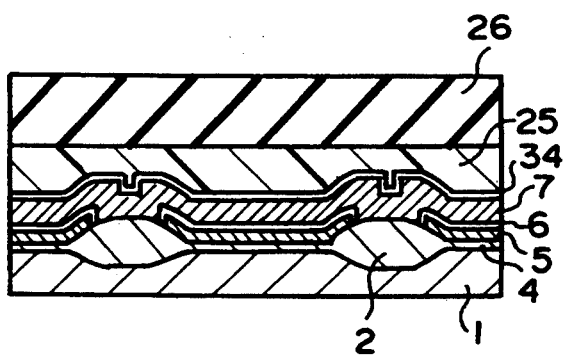
Figure 7A:
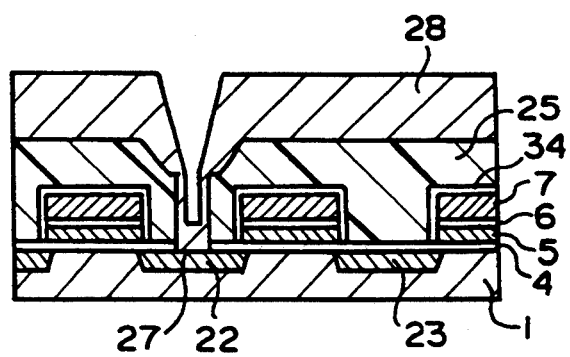
Figure 7B:
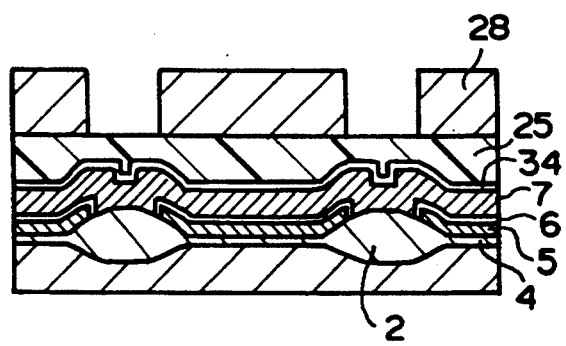
Figure 8:
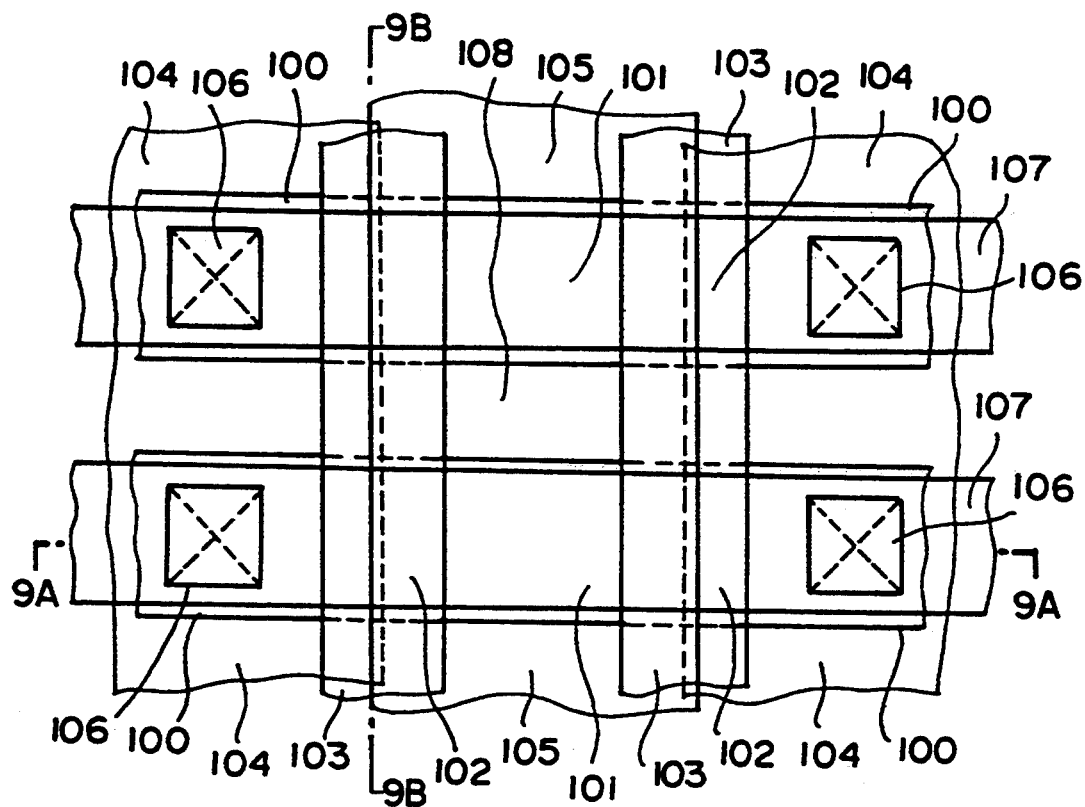
FIG. 8 is a plan view showing a structure of a nonvolatile semiconductor memory device according to the present invention.

FIG. 8 is a plan view showing a structure of a semiconductor memory device according to a first embodiment of the invention, and FIGS. 9A-20A and 9B-20B are sectional views of a semiconductor chip for explaining the sequential steps for fabricating the structure according to the first embodiment of the invention. Specifically, FIG. 9A-20A are sectional views of the structure taken along the line A—A' of FIG. 8 and FIGS. 9B-20B are sectional views of the structure taken along the line B—B' of FIG. 8.

As shown in FIG. 8, the device is constituted by a drain region 100, a source region 101, a channel region and a floating gate electrode 102, a control gate electrode 103, a source contact forming pattern 104, a source wiring region 105, a drain contact hole 106, a metal wiring 107, and an element isolation region 108.

Figure 9A:
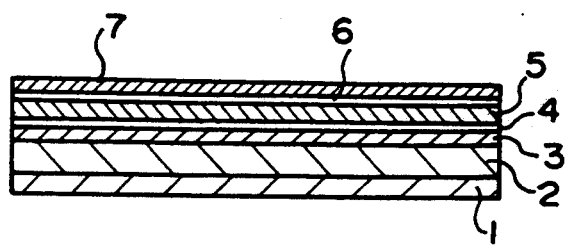
FIGS. 9A, 10A, 11A, 12A, 13A, 14A, 15A, 16A, 17A, 18A, 19A and 20A are sectional views of the structure shown in FIG. 8, taken along the line A—A' in FIG. 8, for explaining sequential fabrication steps of a first embodiment according to the invention.
Figure 9B:
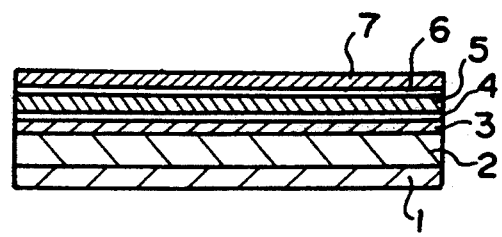
FIGS. 9B, 10B, 11B, 12B, 13B, 14B, 15B, 16B, 17B, 18B, 19B and 20B are sectional views of the structure shown in FIG. 8, taken along the line B—B' in FIG. 8, for explaining the sequential fabrication steps of the first embodiment according to the invention.
Figure 10A:
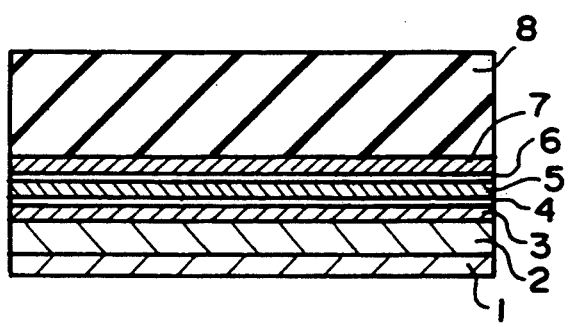
Figure 10B:
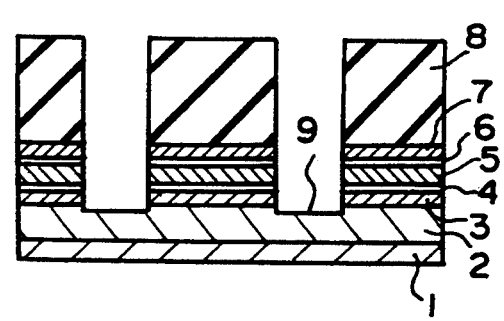

In fabricating the chip, the surface of a semiconductor substrate 1 formed by such as P-type silicon is first oxidized in a steam atmosphere of, for example, 980° C. thereby forming a first insulating film 2 of such as silicon dioxide in a thickness of 6,000 Å. Then, by a low pressure chemical vapor deposition (CVD) technique under 500° C., a first amorphous silicon film (first semiconductor film) 3 of 600 Å thick is deposited, which is annealed for 12 hours, for example, under a nitride atmosphere of 600° C. Next, P-type impurities such as boron (B) are doped to $3 \times 10^{-16}$ cm$^{-3}$ in concentration, followed by a low pressure CVD for forming a first gate insulating film 4 of such as silicon dioxide in a thickness of 250 Å. This is followed by a process such as the low pressure CVD for forming a first polycrystalline silicon film (second semiconductor film) 5 of 1,500 Å thick in which N-type impurities are doped, followed by, for example, a further low pressure CVD for forming a second gate insulating film 6 of such as silicon dioxide in a thickness of 200 Å, and by, for example, a still further low pressure CVD for forming a second polycrystalline silicon film 7 (third semiconductor film) 7 of 500 Å thick in which N-type impurities are doped (FIGS. 9A and 9B).

Thereafter, a patterning mask 8 of such as a resist is patterned so that only the element isolation regions are exposed. Then, with the same patterning mask 8 being used, the second polycrystalline silicon film 7, the second gate insulating film 6, the first polycrystalline silicon film 5, the first gate insulating film 4, and the first amorphous silicon film 3 are sequentially and selectively etched, whereby an element isolation region 9 is formed. For tills etching, anisotropic etching by a reactive ion etching (RIE) technique is generally used. This procedure results in the structure shown in FIGS. 10A and 10B.

Figure 11A:
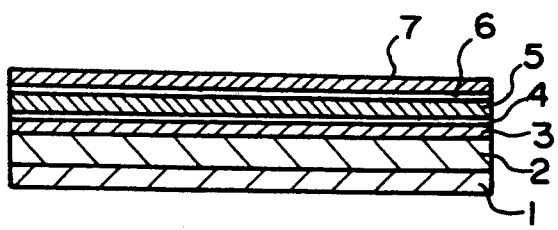
Figure 11B:
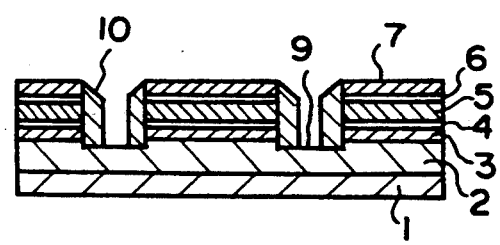

After the patterning mask 8 is removed, such process as a low pressure CVD is performed for forming a second insulating film 10 of such as silicon dioxide in a thickness of 2,000 Å. Then, anisotropic etching by, for example, a reactive ion etching technique is performed to etch-back the second insulating film 10 with sidewalls left in place for the element isolation region 9 (FIGS. 11A and 11B).

Figure 12A:
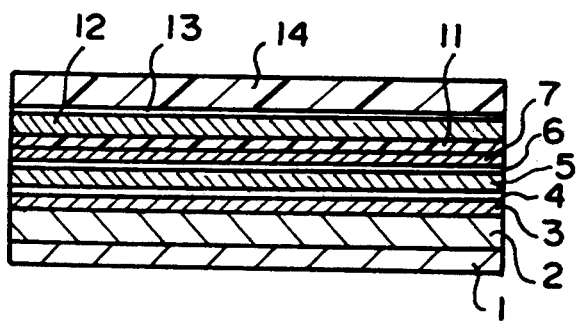
Figure 12B:
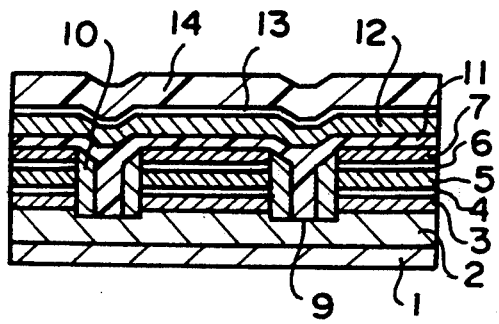

Next, by the low pressure CVD technique, a third polycrystalline silicon film (fourth semiconductor film) 11 is formed in a thickness of 500 Å with N-type impurities being doped and, thereafter, the sputtering is performed to form a silicide film 12 of such as WSi in a thickness of 1,500 Å and a silicon film 13 in a thickness of 500 Å. This is followed by the low pressure CVD to form a third insulating film 14 of such as silicon dioxide in a thickness of 2,500 Å. Thus, the structure shown in FIGS. 12A and 12B is obtained.

Figure 13A:
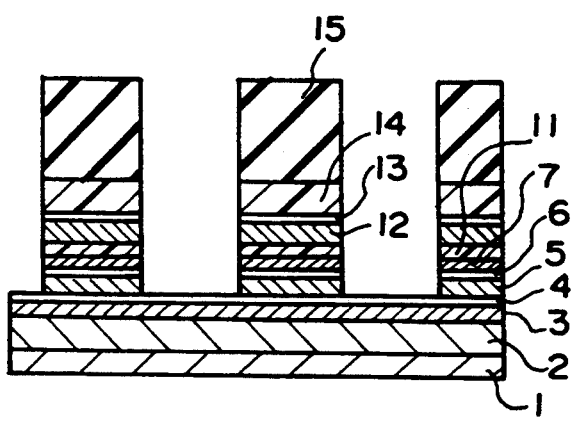
Figure 13B:
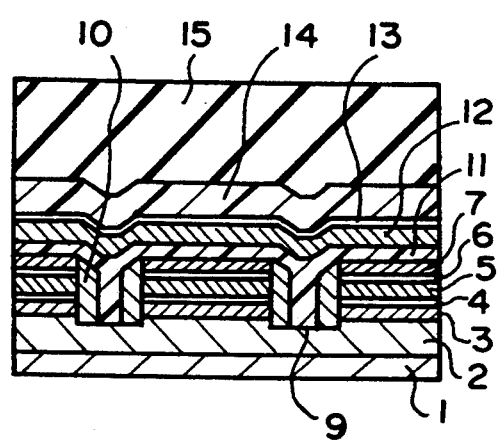
Figure 14A:
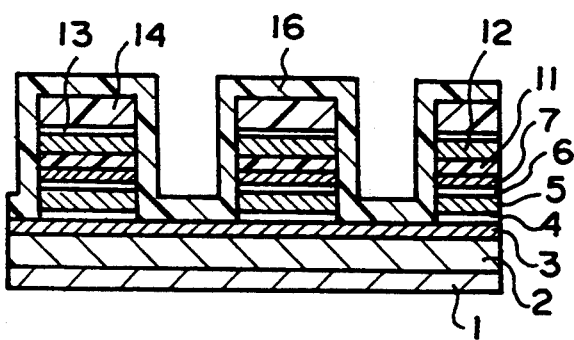
Figure 14B:
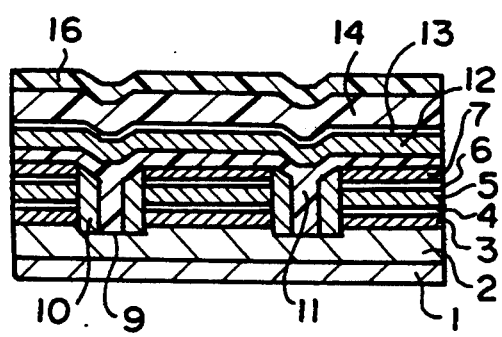

Thereafter, with a patterning mask 15 such as a resist which has been patterned to cover only the control gate electrode region being used, the anisotropic etching is performed by a reactive ion etching technique whereby the third insulating film 14, the silicon film 13, the silicide film 12, the third polycrystalline silicon film 11, the second polycrystalline silicon film 7, the second gate insulating film 6, and the first polycrystalline silicon film 5 are sequentially and selectively etched. Thus, the structure shown in FIGS. 13A and 13B is obtained.

After the patterning mask 15 is removed, a fourth insulating film 16 of such as silicon dioxide having a thickness of 2,000 Å is formed by a process such as a low pressure CVD. This results in the structure shown in FIGS. 14A and 14B.

Figure 15A:
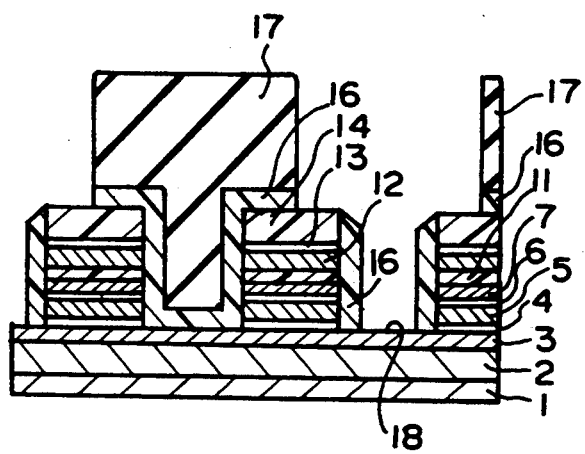
Figure 15B:
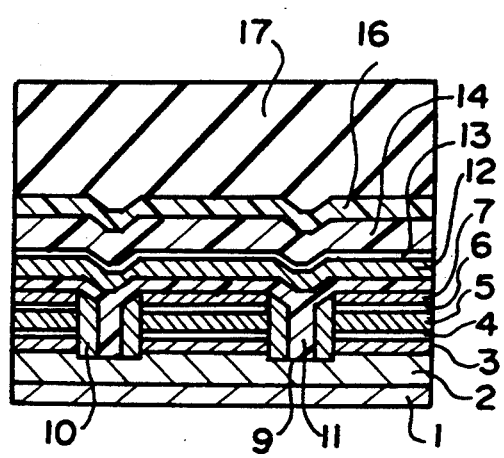
Figure 16A:
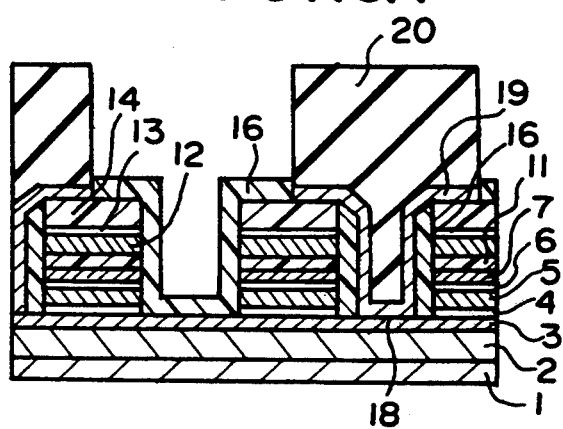
Figure 16B:
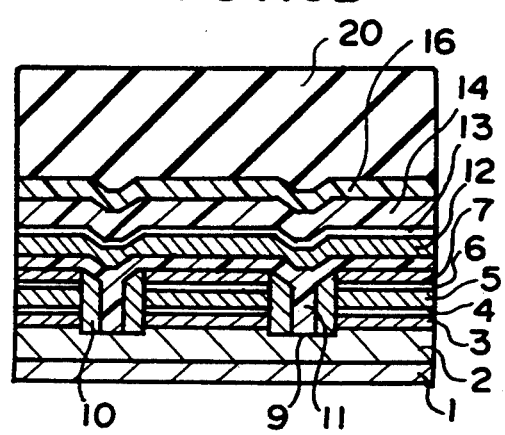

Next, with a patterning mask 17 such as a resist which has been patterned so as to cover only the source region being used, the fourth insulating film 16 is etched-back by a reactive ion etching method, thereby forming a source contact hole 18. Thus, the structure shown in FIGS. 15A and 15B is obtained.

Next, the patterning mask 17 is removed. Then, after a fourth polycrystalline silicon film 19 of 1,000 Å thick in which N-type impurities are doped is formed by, for example, a low pressure CVD, a patterning mask 20 of such as a resist is patterned so as to cover the source contact hole and the etching such as a reactive ion etching is performed. This results in the structure shown in FIGS. 16A and 16B.

Figure 17A:
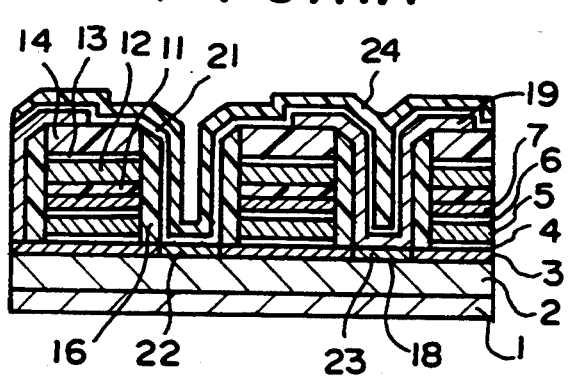
Figure 17B:
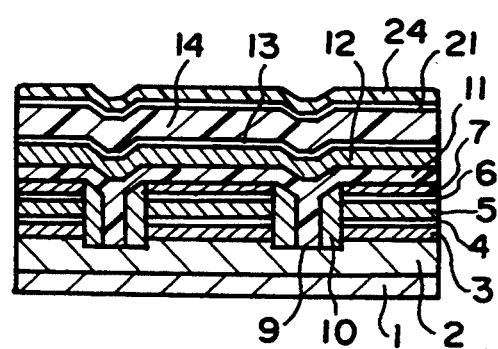

Next, the patterning mask 20 is removed. Then, after the fourth insulating film 16 at the drain side is etched-back using a reactive ion etching method, a fifth insulating film 21 of such as silicon dioxide having a thickness of 250 Å is formed by an atmospheric pressure CVD method as a mask for doping impurities, and N-type impurities such as arsenic (As) are doped in high concentration whereby a drain region 22 and a source region 23 are formed. Next, by using the atmospheric pressure CVD method, a sixth insulating film 24 of such as silicon dioxide having a thickness of 1,000 Å is formed. Thus, the structure shown in FIGS. 17A and 17B is obtained.

Figure 18A:
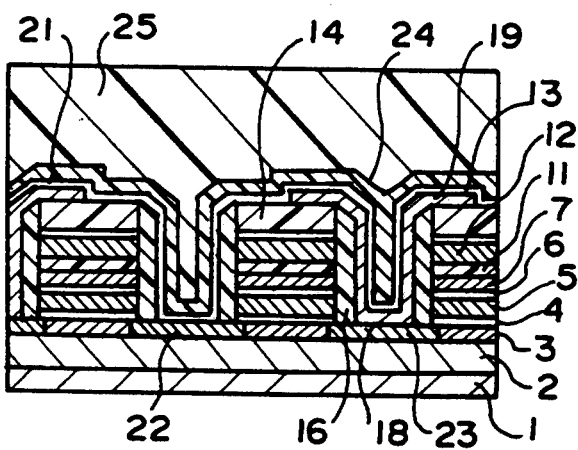
Figure 18B:
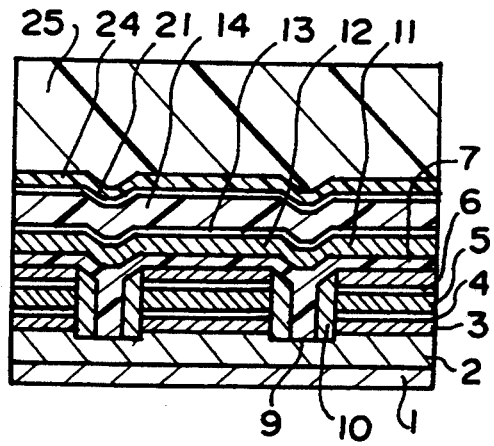
Figure 19A:
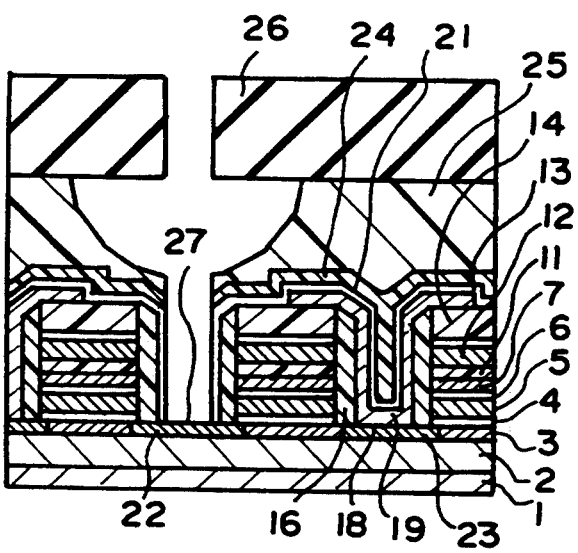
Figure 19B:
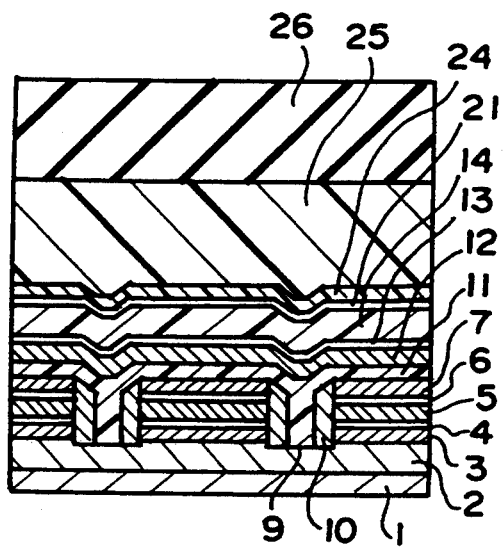

Thereafter, by the low pressure CVD method, a first interlayer insulating film 25 of such as TEOS and BPSG is formed in a thickness of 8,000 Å and is subjected to a reflow process for flattening for 30 minutes under a nitride atmosphere of 900° C., which results in the structure shown in FIGS. 18A and 18B.

Next, with a patterning mask 26 of such as a resist which has been patterned so as to expose only the drain contact portion being used, a drain contact 27 is formed using a known method. This results in the structure shown in FIGS. 19A and 19B.

Figure 20A:
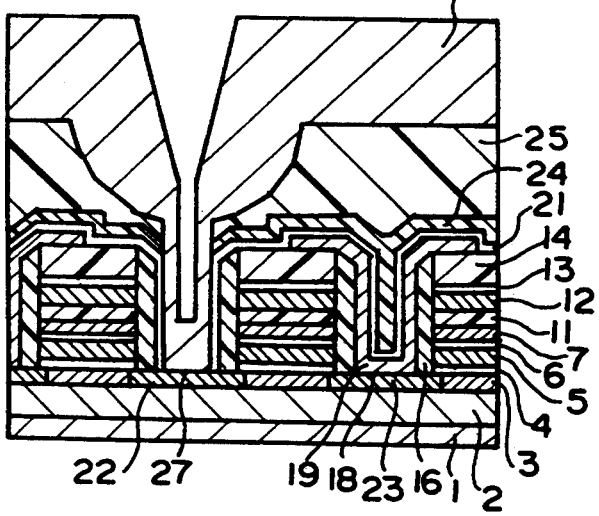
Figure 20B:
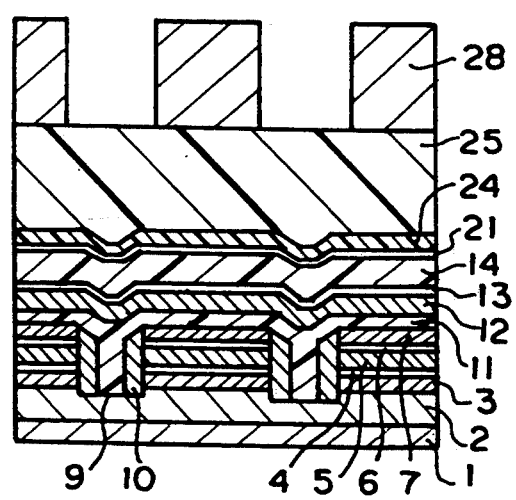
Figure 21A:
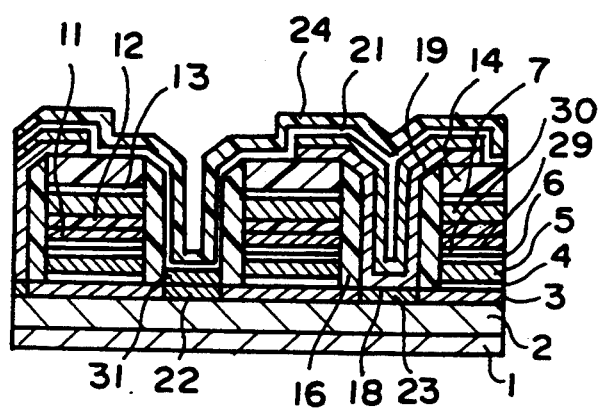
FIGS. 21A, 22A, 23A and 24A are sectional views of the structure shown in FIG. 8, taken along the line A—A' in FIG. 8, for explaining some of the sequential fabrication steps of a second embodiment according to the invention.
Figure 21B:
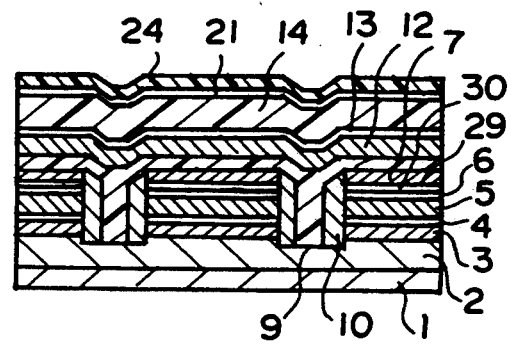
FIGS. 21B, 22B, 23B and 24B are sectional views of the structure shown in FIG. 8, taken along the line B—B' in FIG. 8, for explaining some of the sequential fabrication steps of the second embodiment according to the invention.

After the patterning mask 26 is removed, a metal wiring 28 of such as aluminum (Al) having a thickness of 8,000 Å is formed, whereby the non-volatile semiconductor memory device shown in FIGS. 20A and 20B is obtained.

In the conventional method for fabricating the non-volatile semiconductor memory device, the element isolation region is formed by directly oxidizing an upper portion of the semiconductor substrate. Furthermore, the patterning of the floating gate electrode is effected by giving margin or tolerance with respect to the channel region. Also, the drain region, the source region and the channel region are formed directly on the semiconductor substrate.

In contrast to the above, the first feature in the structure according to the first embodiment of the present invention is in the arrangement wherein the drain region, the source region and the channel region are provided on the first amorphous silicon film which is on the first insulating film. In this way, when the voltage is applied to the drain and source regions, there is no flow of a junction leakage current to the semiconductor substrate and, thus, there is no waste in power consumption.

The second feature of the invention is that the gate electrode and the element isolation region are made to have a self-alignment relation. Because of this, there is no need to provide margin or tolerance for the floating gate electrode with respect to the channel region. Also, since the element isolation region is formed in self-alignment, it is possible to widen the channel width even when the memory cell is scaled down and, furthermore, since the distance between element isolation regions can be reduced, it is possible to make higher integration of the device.

In the above embodiment of the Invention, the control gate electrode adopts a polycide structure of two layers, one being a polycrystalline silicon film and the other being a silicide film. Since the silicide film has a characteristic of low resistance, it is possible to advantageously lower a film resistance in the control gate electrode.

Next, the second embodiment of the invention will be explained hereunder.

FIGS. 21A–24A and 21B–24B are sectional views showing the fabrication steps of the structure according to the second embodiment of the invention. FIGS. 21A to 24A show sections taken along the line A—A' of FIG. 8, and FIGS. 21B to 24B show sections taken along the line B—B' of FIG. 8.

After the completion of the same steps as those explained for the first embodiment with reference to FIGS. 9A and 9B through FIGS. 16A and 16B, the patterning mask 20 is removed. Then, the fourth insulating film 16 at the drain side is etched-back by a reactive ion etching method and, thereafter, a metal film of such as Ti in a thickness of 500 Å is formed by, for example, a sputtering method, is annealed at 800° C. and is converted into a salicide layer 31. The Ti which has not undergone the compound reaction is etched away. Then, the fifth insulation film 21 is formed in the same way as in the first embodiment and, by doping N-type impurities, the drain region 22 and the source region 23 are formed and the sixth insulating film 24 is also formed. This results in the structure shown in FIGS. 21A and 21B.

Figure 22A:
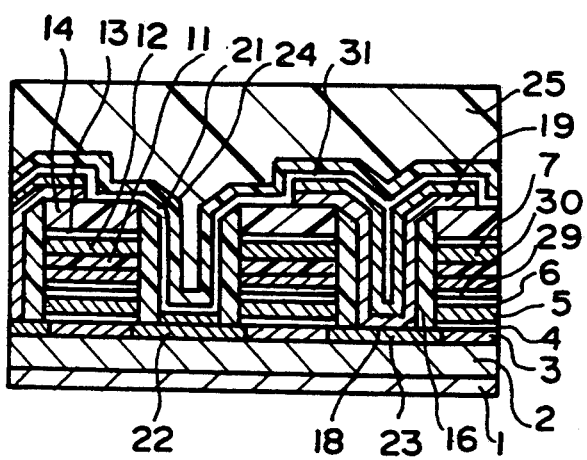
Figure 22B:
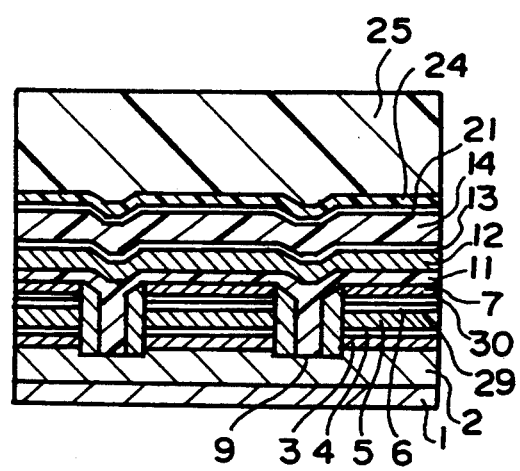

Then, the first interlayer insulating film 25 is formed as in the first embodiment and, thus, the structure shown in FIG. 22A and 22B is obtained.

Figure 23A:
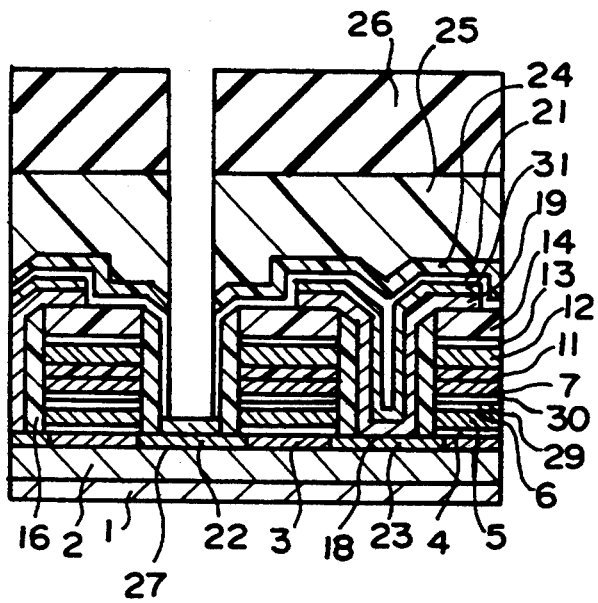
Figure 23B:
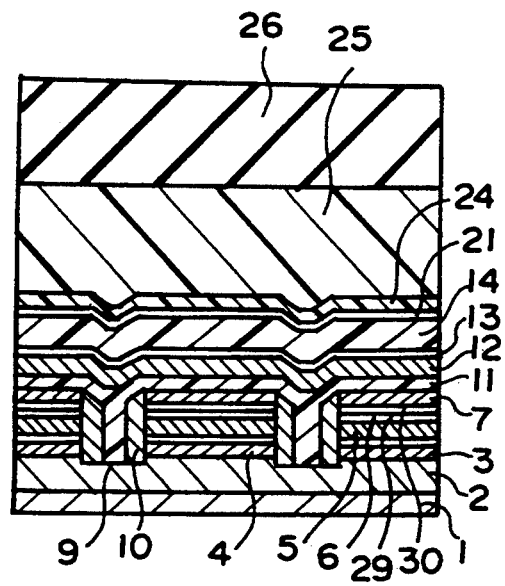

Next, by using a patterning mask 26 of such as a resist in the same way as in the first embodiment, the drain contact hole 27 is formed as shown in FIGS. 23A and 23B.

Figure 24A:
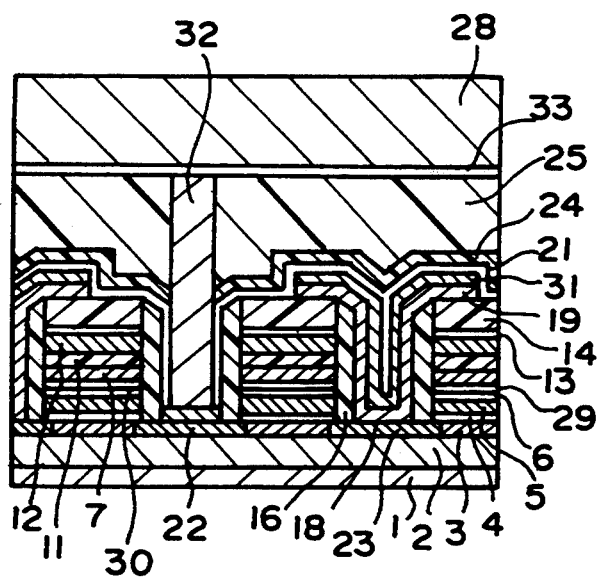
Figure 24B:
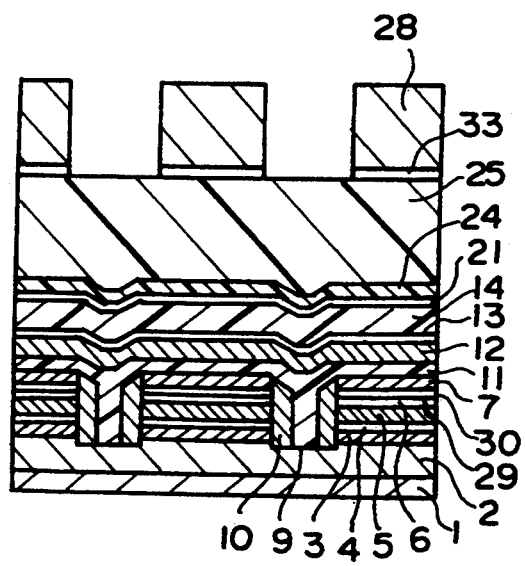

After the patterning mask 26 is removed, a fifth polycrystalline silicon film 32 of 10,000 Å thick in which N-type impurities are doped is formed by, for example, the low pressure CVD method, is etched-back by a reactive ion etching method and is buried into the drain contact hole 27. Thereafter, a barrier metal 33 of such as TiW having a thickness of 600 Å and a metal wiring 28 of such as aluminum having a thickness of 8,000 Å are formed and patterned by the sputtering method, whereby the non-volatile semiconductor memory device shown in FIGS. 24A and 24B is obtained.

In the above explained second embodiment, the first feature resides in the arrangement in which a salicide structure is provided on the drain region and the source region. It is known that the film resistance of the diffusion layer (drain and source regions) provided on the amorphous silicon film is higher than that of the diffusion layer provided on the semiconductor substrate. For this reason, it is by arranging as above that film resistance of the diffusion layer can be lowered. The second feature is that the drain contact is in the form of an embedded contact. In this way, it is possible to prevent the metal wiring from breaking at the contact region.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for fabricating a non-volatile semiconductor memory device with a two-layered gate electrode structure having a control gate electrode and a floating gate electrode, said method comprising the steps of:

depositing and forming sequentially on a surface of a semiconductor substrate a first insulating film, a first semiconductor film, a first gate insulating film, a second semiconductor film, a second gate insulating film, and a third semiconductor film;

removing sequentially and selectively a region of each of said third semiconductor film, said second gate insulating film, said second semiconductor film, said first gate insulating film, and said first semiconductor film, such that an element isolation region is formed on said semiconductor substrate in self-alignment with said floating gate electrode;

forming and etching-back a second insulating film; and depositing and forming a fourth semiconductor film.

2. A method for fabricating a non-volatile semiconductor memory device according to claim 1, in which said first semiconductor film is formed as source/drain regions and a channel region, said second semiconductor film is formed as a floating gate electrode, and said third semiconductor film and said fourth semiconductor film are formed as a control gate electrode, and in which regions between adjacent ones of said first semiconductor films are element isolation regions.

3. A method for fabricating a non-volatile semiconductor memory device with a two-layered gate electrode structure having a control gate electrode and a floating gate electrode, said method comprising the steps of:

depositing and forming sequentially on a surface of a semiconductor substrate a first insulating film, a first semiconductor film, a first gate insulating film, a second semiconductor film, a second gate insulating film, and a third semiconductor film;

removing sequentially and selectively a first region of each of said third semiconductor film, said second gate insulating film, said second semiconductor film, said first gate insulating film, and said first semiconductor film, such that an element isolation region is formed on said semiconductor substrate in self-alignment with said floating gate electrode;

forming and etching-back a second insulating film;

depositing and forming sequentially a fourth semiconductor film and a third insulating film;

removing sequentially and selectively second regions of said third insulating film, said fourth semiconductor film, said third semiconductor film, said second gate insulating film, and said second semiconductor film; and forming source/drain regions.

4. A method for fabricating a non-volatile semiconductor memory device according to claim 3, in which said first semiconductor film at a region below the floating gate electrodes is formed as a channel region and said first semiconductor film in all the remaining region is formed as source/drain regions, said second semiconductor film is formed as the floating gate electrode, and said third semiconductor film and said fourth semiconductor film are formed as the control gate electrode.

* * * * *